(12) United States Patent
Brennan

(10) Patent No.: US 6,211,072 B1
(45) Date of Patent: Apr. 3, 2001

(54) CVD TIN BARRIER PROCESS WITH IMPROVED CONTACT RESISTANCE

(75) Inventor: William S. Brennan, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/314,737

(22) Filed: May 19, 1999

(51) Int. Cl.[7] .................................................. H01L 21/4763
(52) U.S. Cl. ......................... 438/648; 438/644; 438/654
(58) Field of Search ..................................... 438/628, 644, 438/654, 118, 119, 648, 120, 649

(56) References Cited

U.S. PATENT DOCUMENTS

| | | | |
|---|---|---|---|
| 5,918,149 | * 6/1999 | Besser et al. | 438/680 |
| 5,956,613 | * 9/1999 | Zhao et al. | 438/648 |
| 5,990,004 | * 11/1999 | Yang et al. | 438/648 |
| 5,994,775 | * 11/1999 | Zhao et al. | 438/643 |
| 6,054,382 | * 4/2000 | Hsu et al. | 438/628 |
| 6,056,999 | * 5/2000 | Narasimhan | 427/249 |

OTHER PUBLICATIONS

Stanley Wolf and Richard N. Tauber; *Silicon Processing for the VLSI Era; vol. 1: Process Integration*; pp. 399–405; 1986.

Stanley Wolf and Richard N. Tauber; *Silicon Processing for the VLSI Era; vol. 3: Process Integration*; pp. 244–248; 1990.

* cited by examiner

*Primary Examiner*—David Nelms
*Assistant Examiner*—Dung A Le
(74) *Attorney, Agent, or Firm*—Timothy M. Honeycutt

(57) ABSTRACT

Methods of fabricating ohmic contacts and adhesion layers therefore are provided. In one aspect, a method of fabricating an ohmic contact in an opening of an insulating layer is provided. Tetra-dimethyl-amino-titanium vapor is decomposed in the presence of the opening to deposit TiCN in the opening at a rate of about 9.4 to 10.6 Å/second and a thickness of less than about 105 Å. The deposited TiCN is exposed to a plasma ambient containing nitrogen and hydrogen to remove carbon and oxygen from the deposited TiCN. A conducting material is deposited on the TiCN. Controlled TiCN thickness, and subsequent plasma treatment dissociate most of the carbon and oxygen incorporated into the TiCN layer during deposition. The potential for undesirably high contact resistance due to oxygen and carbon-based insulating structures within the adhesion layer is reduced.

20 Claims, 3 Drawing Sheets

CVD TIN BARRIER PROCESS WITH IMPROVED CONTACT RESISTANCE

BACKGROUND OF THE INVENTION

1. Field of the Invention

This invention relates generally to semiconductor fabrication, and more particularly to a method of fabricating a titanium nitride layer on an underlying structure.

2. Description of the Related Art

The fabrication of multi-level metallization structures in integrated circuit processing involves the alternating and sequential fabrication of various metal and interlevel dielectric layers. Interconnections between adjacent metal layers are ordinarily established by means of a plurality of contacts or local interconnects extending through the interlevel dielectric layer that separates the metal layers. A conventional method frequently employed to form local interconnect structures involves a process in which a passivation layer of dielectric material, such as a silicon dioxide or tetra-ethyl-ortho-silicate ("TEOS") is blanket deposited. The interlevel dielectric layer is then lithographically patterned and etched to form vias where the contact structures will be deposited. The conducting material is next deposited in the vias, either concurrently with or prior to a later process step to form the next metal layer.

Early semiconductor fabrication processes utilized sputter deposited aluminum in conjunction with either straight or sloped sidewall vias. Straight sidewall vias required less substrate area than sloped sidewall vias and were often easier to produce using dry etching than sloped sidewalls. However, when physical vapor deposition is used to deposit metal over the vias, straight sidewalls can result in worse step coverage by the metal film than if the sidewalls were sloped.

Several methods have been developed to improve the step coverage of sputtered metal films. The first method involves the optimization of the deposition conditions by increasing the surface-migration ability of the atoms that have already arrived on the surfaces of the via. An example of this optimization involves the heating of the substrate during deposition and/or the bombardment of the substrate by ions through bias sputtering. Another technique for improving step coverage has been to maintain the aspect ratios of the vias below limits where step coverage falls off sharply.

Although sloped vias and attempted optimization of sputter conditions improved step coverage in some circumstances, the extra area needed to accommodate sloped vias severely limited the maximum packing density for a given substrate, particularly in processing at sub-micron levels. Furthermore, even with various techniques for optimizing the physical vapor deposition of metals, difficulties with contact resistance due to native oxides and inadequate step coverage rendered conventional physical vapor deposition metal via filling inadequate for some processes.

A more recent innovation in contact formation involves the fabrication of straight walled vias followed by complete fill with metal. Among various metals, tungsten has been frequently used to fill straight walled vias. In a typical process, tungsten is deposited by blanket chemical vapor deposition ("CVD") and then planarized back to the upper surface of the interlevel dielectric layer by etching or chemical mechanical polishing. Prior to the blanket CVD of tungsten, an adhesion layer is deposited on the substrate surface and in the vias. The adhesion layer is a necessary precursor to the blanket CVD of tungsten due to the extremely poor adhesion of CVD tungsten on typical interlevel dielectric materials, such as thermal and plasma enhanced oxides, silicon nitride, TEOS and boro-phospho-silicate-glass ("BPSG"). Some examples of typical adhesion layer materials include TiN and/or Ti/TiN. These materials generally adhere well to the aforementioned insulator materials, and tungsten, in turn, typically adheres well to these types of adhesion layer materials.

A disadvantage associated with conventional fabrication of TiN adhesion layers is the potential for high and unpredictably variable contact resistance of the finished tungsten contact following fabrication. In many conventional processes, TiN is deposited by decomposing an organo-metallic compound of titanium in a processing chamber. The decomposition process leaves a film that is composed primarily of titanium carbo nitride, but also includes amounts of titanium-carbon-oxygen-nitrogen compounds, pure TiN, and diffused carbon and oxygen. The carbon is a byproduct of the organo-metallic titanium compound. The incorporation of oxygen is an unwanted result of residual oxygen that is almost always present in the processing chamber. By themselves, these carbon and oxygen impurities increase the resistivity of the adhesion layer. Perhaps more significantly, the carbon and oxygen impurities may react with the byproducts of the tungsten plug CVD process. Most tungsten deposition processes utilize the reduction of tungsten/fluorine ($WF_6$) or tungsten/chlorine ($WCl_6$) compounds by silane or another type of reducing agent. The byproducts of the silane reduction may react with the carbon and oxygen impurities in the TiN layer, resulting in the localized formation of nucleated insulating structures. These unwanted insulating structures, such as $SiO_2$ or SiC, may adversely impact the contact resistance and subsequence film stack resistivity of the contact.

The present invention is directed to overcoming or reducing the effects of one or more of the foregoing disadvantages.

SUMMARY OF THE INVENTION

In accordance with one aspect of the present invention, a method of fabricating a conducting layer on a structure is provided. Tetrakis-dimethyl-amino-titanium vapor is decomposed in the presence of the structure to deposit a layer containing titanium nitride and a compound of titanium, nitrogen and carbon at a rate of about 9.4 to 10.6 Å/second and a thickness of less than about 105 Å. The deposited layer is exposed to a plasma ambient containing nitrogen and hydrogen to remove carbon and oxygen therefrom.

In accordance with another aspect of the present invention, a method of fabricating an adhesion layer in an opening of an insulating layer is provided. Tetrakis-dimethyl-amino-titanium vapor is decomposed in the presence of the opening to deposit a layer containing titanium nitride and a compound of titanium, nitrogen and carbon in the opening at a rate of about 9.4 to 10.6 Å/second and a thickness of less than about 105 Å. The deposited layer is exposed to a plasma ambient containing nitrogen and hydrogen to remove carbon and oxygen therefrom.

In accordance with another aspect of the present invention, a method of fabricating an ohmic contact in an opening of an insulating layer is provided. Tetrakis-dimethyl-amino-titanium vapor is decomposed in the presence of the opening to deposit a layer containing titanium nitride and a compound of titanium, nitrogen and carbon in the opening at a rate of about 9.4 to 10.6 Å/second and a thickness of less than about 105 Å. The deposited layer is exposed to a plasma ambient containing nitrogen and hydrogen to remove carbon and oxygen therefrom. A conducting material is deposited on the layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
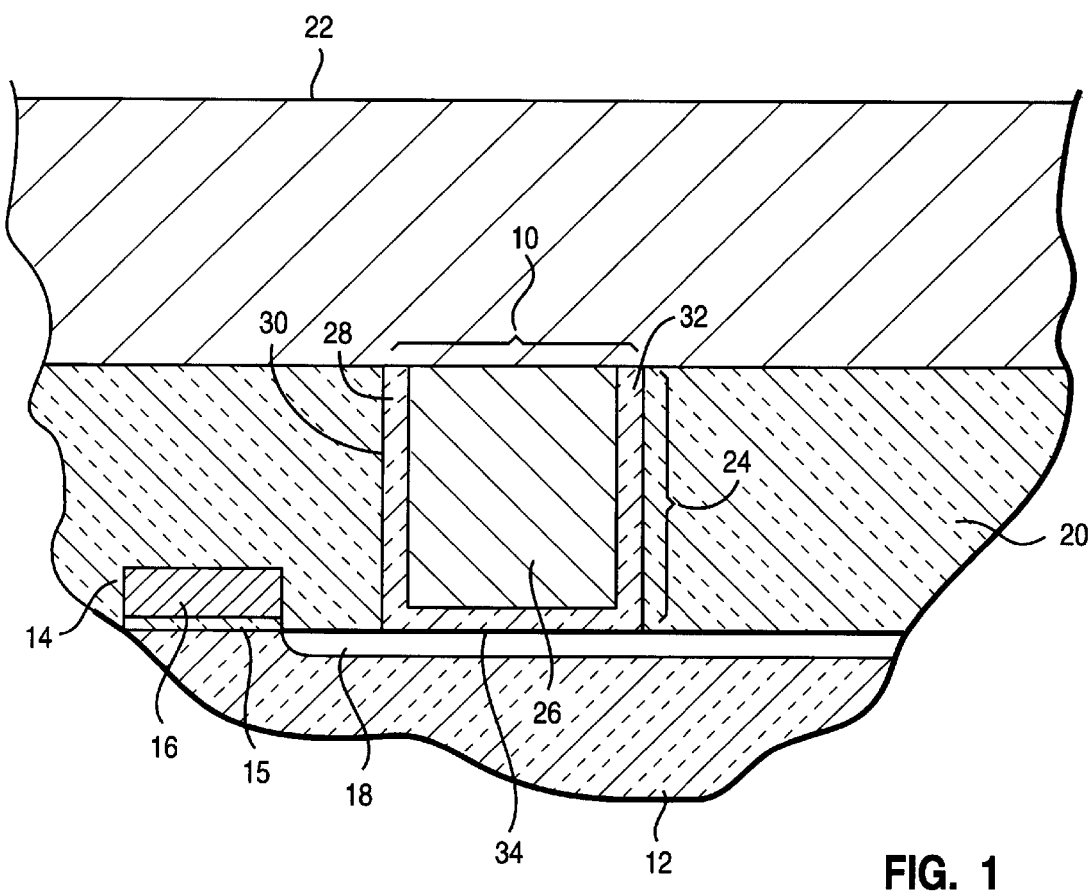
FIG. 1 is a cross-sectional view of an exemplary embodiment of an ohmic contact fabricated on a semiconductor substrate in accordance with the present invention.

In the drawings described below, reference numerals are generally repeated where identical elements appear in more than one figure. Turning now to the drawings, and in particular to FIG. 1, there is shown a cross-sectional view of an exemplary embodiment of an ohmic contact 10 ("hereinafter contact 10") positioned on a semiconductor substrate 12. The semiconductor substrate 12 may be composed of n-doped silicon, p-doped silicon, silicon-on-insulator or other suitable substrate materials. A circuit device 14 is implemented on the semiconductor substrate 12. For the purposes of the this illustration, the circuit device 14 is depicted as a field effect transistor. However, the device 14 may be a variety of circuit devices used in integrated circuits. The transistor 14 includes a gate insulating layer 15, a gate electrode 16 positioned on the gate insulating layer 15, a first source/drain region 18 formed in the substrate 12 and another substantially identical source/drain region that is not shown. As used herein, the terms "formed on", "disposed on" or "positioned on" should be construed to include the possibility that a given layer or structure may be formed on another given layer or structure with a third or other intervening layers or structures disposed between the two. The contact 10 is surrounded by an interlevel dielectric layer 20 that covers the transistor 14. A conductor layer 22 is formed on the interlevel dielectric layer 20 and may be a global interconnect or local interconnect layer composed of metal, metal silicide, polysilicon or the like.

The contact 10 is designed to provide an electrical pathway between an underlying silicon structure, such as the source/drain region 18 or the gate electrode 16, and an overlying conductor structure, in this case the conductor layer 22. The contact 10 is positioned in an opening 24 formed in the interlevel dielectric layer 20 and includes a conducting plug 26 and an adhesion layer 28 that coats the sidewalls 30 and 32 and the bottom 34 of the opening 24. As described more fully below, the adhesion layer 28 is advantageously composed of TiN while the conducting plug 26 is composed of a conducting material, such as tungsten, Al, Cu, or the like.

Figure 2:
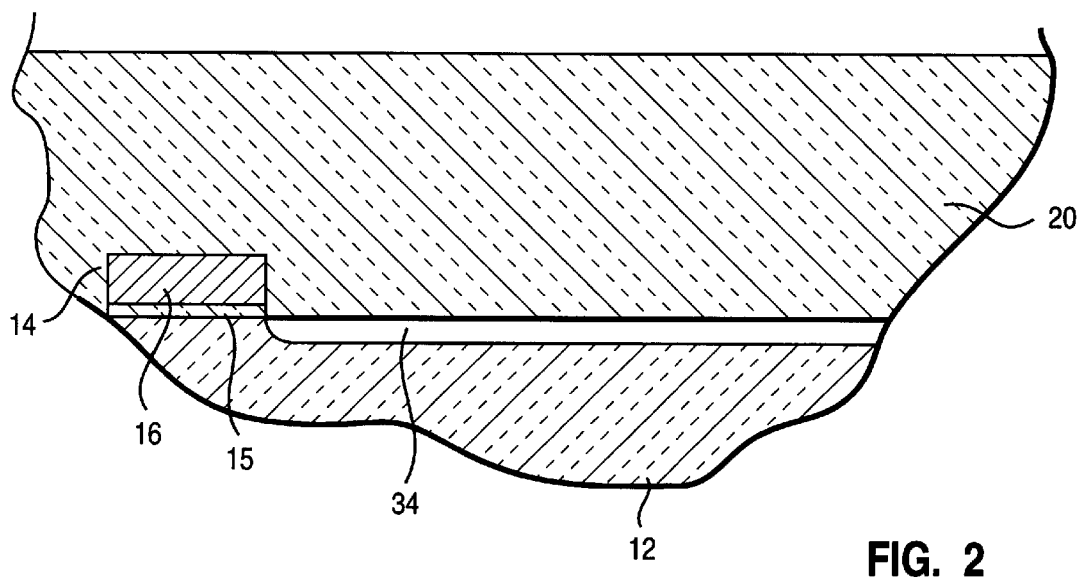
FIG. 2 is a cross-sectional view of an exemplary semiconductor substrate with a transistor formed thereon coated by an interlevel dielectric layer in accordance with the present invention.

An exemplary process flow for fabricating the contact 10 in accordance with the present invention may be understood by referring now to FIGS. 2, 3, 4, 5 and 6, and initially to FIG. 2. FIG. 2 is a cross-sectional view of the substrate 12 following the fabrication of the transistor 14 and the interlevel dielectric layer 20. The transistor 14 may be fabricated using well known and established methods for fabricating transistors. The interlevel dielectric layer 20 is applied following fabrication of the transistor 14 and may be composed of a variety of insulating materials commonly used for interlevel dielectric layers, such as, for example, TEOS, thermal and plasma enhanced oxides, silicon nitride, BPSG, or the like. Well known CVD techniques may be used to deposit the layer 20. In an exemplary embodiment, the interlevel dielectric layer 20 is composed of TEOS and is applied using CVD to a thickness of about 0.5 to 2.5 $\mu$m.

Figure 3:
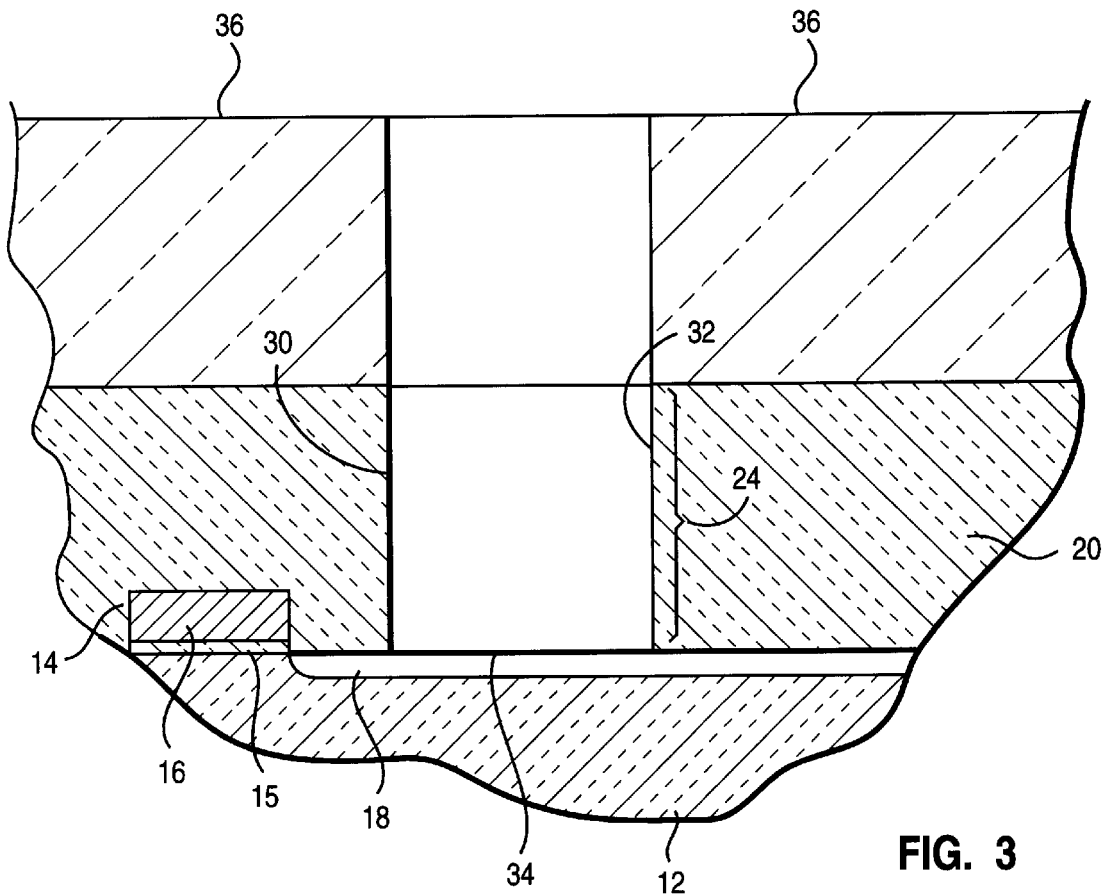
FIG. 3 is a cross-sectional view like FIG. 2 depicting fabrication of an opening in the interlevel dielectric layer in accordance with the present invention.

The fabrication of the opening 24 may be understood by referring now to FIG. 3. The interlevel dielectric layer 20 is masked with a photomask 36 composed of resist that is patterned, that is, exposed and developed to yield the desired pattern for the later-formed opening 24. With the photomask 36 in place, the interlevel dielectric layer 20 is anisotropically etched selectively to the underlying substrate 12 to yield the opening 24 with substantially vertical sidewalls 30 and 32. An upper surface of the source/drain region 18 defines the bottom 34 of the opening 24. The etch of the opening 24 may be accomplished using a variety of well known anisotropic etching techniques, such as, for example, reactive ion etching, chemical plasma etching or other like techniques, and may use a variety of etch chemistries suitable to anisotropically etch TEOS selectively to silicon or a refractory metal silicide layer if present. In an exemplary embodiment, the opening 24 is defined by reactive ion etching using $CHF_3$. The lateral dimension or width of the opening 24 is largely a matter of design discretion. In an exemplary embodiment, the opening 24 may be about 0.2 to 0.5 $\mu$m in width.

Figure 4:
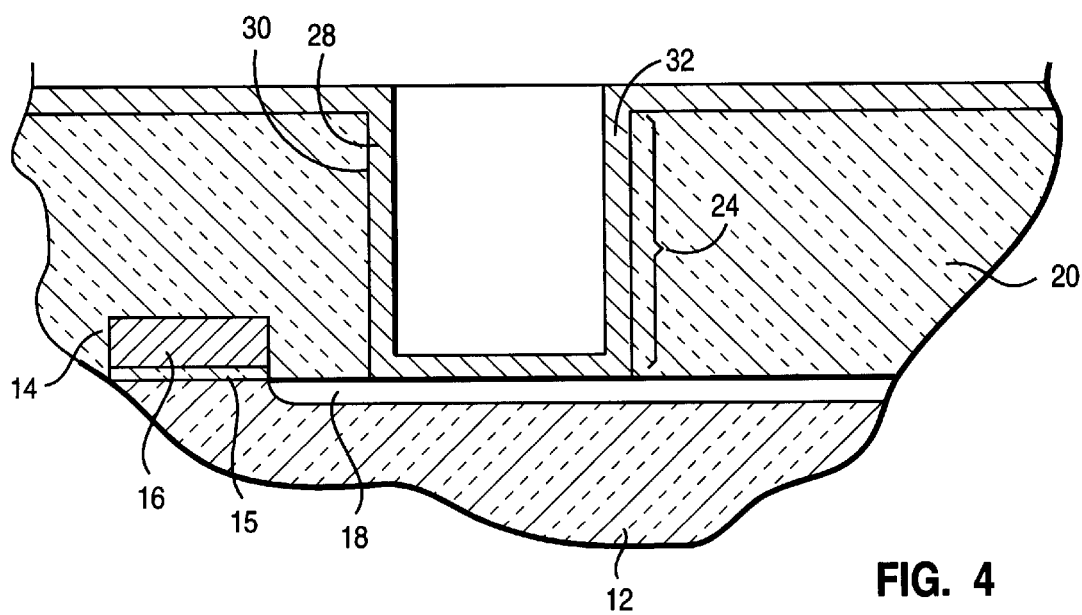
FIG. 4 is a cross-sectional view like FIG. 3 depicting fabrication of an adhesion layer in the opening in accordance with the present invention.

The fabrication of the adhesion layer 28 may be understood by referring now to FIG. 4. Initially, the photomask 36 depicted in FIG. 3 is stripped by ashing, chemical removal or other well known removal techniques. The adhesion layer 28 is then established by blanket CVD of TiN on a structure, namely the layer 20 and in the opening 24, followed by a plasma treatment. The CVD is performed by exposing the opening 24 to vapor phase tetrakis-dimethyl-amino-titanium ("TDMAT") in a processing tool (not shown). The TDMAT undergoes thermal decomposition, leaving a layer 28 composed largely of TiCN with some TiN. Overall, the layer 28 has a carbon content of about 30 to 40 atomic percent carbon. This relatively high carbon content is a natural outcome of the use of TDMAT as a source of CVD TiN. In addition to the anticipated carbon concentration, some residual oxygen in the processing tool usually diffuses into the layer 28 during the CVD process. The high carbon content and diffused oxygen constitute the primary and second sources of the aforementioned high and variable resistivity problems presented by conventional processes. To compensate for the deleterious effects of the high carbon content and oxygen contamination, the CVD TiN process in accordance with the present invention is tailored so that most of the carbon and oxygen may be dissociated from the layer 28 via a subsequent plasma treatment.

In an exemplary embodiment, TDMAT heated to about 60° C. and mixed with an inert carrier gas, such as, for example, a 500 cc/minute flowing stream of helium. The TDMAT/helium mixture is then exposed to the substrate 12, and thus the opening 24, at about 1.3 to 1.7 torr. Prior to introduction of the TDMAT vapor, the substrate 12 is preheated to a temperature that will provide a deposition rate that yields uniform film thickness.

The duration of the deposition process will depend upon the desired thickness and deposition rate of the adhesion layer 28. The efficiency of the below-described plasma treatment process in dissociating carbon and oxygen from the layer 28 is dependent upon the thickness of the layer 28. The efficiency falls off where the layer 28 is deposited to a thickness of greater than about 105 Å. A uniform film thickness may be obtained by maintaining the deposition rate of TiCN between about 9.4 to 10.6 Å/second. That deposition rate range may be obtained by heating the substrate 12 to about 400 to 420° C. Accordingly, the deposition is performed for about 10 seconds or less.

Following the deposition step, the layer 28 is subjected to a plasma treatment that is designed to dissociate and convey carbon and oxygen away from layer 28. In this regard, the adhesion layer 28 is exposed to a plasma ambient containing hydrogen and nitrogen at a pressure of about 1.3 to 1.7 torr, an Rf of 13.56 MHz and a plate power setting of about 750 Watts. The plasma ambient is designed to provide both kinetic displacement and chemical capture of carbon and oxygen. The nitrogen atoms provide ion bombardment to displace carbon and oxygen atoms in the adhesion layer 28 while the hydrogen atoms bond with the dissociated carbon and oxygen atoms within the plasma ambient. The duration of the plasma treatment may be about 30 to 40 seconds. The concentrations of hydrogen and nitrogen are largely matters of design discretion. In an exemplary embodiment, the plasma ambient contains about 300 cc of nitrogen and about 500 cc of hydrogen.

The plasma treatment advantageously reduces the carbon content of the layer 28 to about 5 atomic percent. This large reduction in carbon concentration and liberation of oxygen significantly reduces the potential for high resistivity due to carbon and oxygen and to the SiC and $SiO_2$ nucleated structures that may otherwise form in the layer 28. Note that the dissociation of both carbon and oxygen results in a densification and thining of the layer 28. Where the layer 28 is initially deposited to a thickness of about 100 Å, the plasma treatment will thin the layer 28 to a thickness of about 45 to 50 Å.

The deposition/plasma treatment process to fabricate the adhesion layer 28 may be performed in a single process as described above, or may be separated into two or more sequential deposition and plasma treatment steps to produce a layer 28 with a greater thickness without sacrificing the efficiency of the plasma treatment. The skilled artisan will appreciate that a relatively thicker layer 28 will be more resistant to fluorine or chlorine diffusion during subsequent tungsten deposition. In this regard, a first CVD step may be performed using the aforementioned parameters for approximately 10 seconds to establish about a 90 to 105 Å thick layer of TiCN which is then subjected to the aforementioned plasma treatment process. The first plasma treatment thins the first TiCN layer to about 45 to 50 Å. Subsequent to the first plasma treatment step, a second CVD step may be performed using the aforementioned parameters for about 10 seconds to apply about a 90 to 105 Å layer of TiCN on the 45 to 50 Å layer of plasma treated TiCN. The second CVD step is followed by a second plasma treatment step using the aforementioned parameters to condense and thin the second CVD TICN layer to about 45 to 50 Å and leave a layer 28 with a total thickness of about 90 to 110 Å. In this way, each of the two plasma treatment processes will operate against a relatively thin layer of TiCN, and thus increase the efficiency of the plasma treatment in dissociating carbon and oxygen from the TiCN.

In the foregoing illustration, the CVD/plasma treatment of the layer 28 is sequenced into two CVD steps of equivalent film thickness and two plasma steps. However, the skilled artisan will appreciate that the CVD/plasma treatment of the layer 28 may be accomplished in greater than two CVD and plasma steps and with different film thicknesses applied for each CVD step if desired.

A variety of CVD tools may be used to fabricate and plasma treat the adhesion layer 28. In an exemplary embodiment, an Applied Materials Endura Integrated Liner Barrier tool is used. However, the skilled artisan will appreciate that the aforementioned CVD and plasma treatment parameters may be varied accordingly to suit the operational characteristics of other types and brands of tools.

Figure 5:
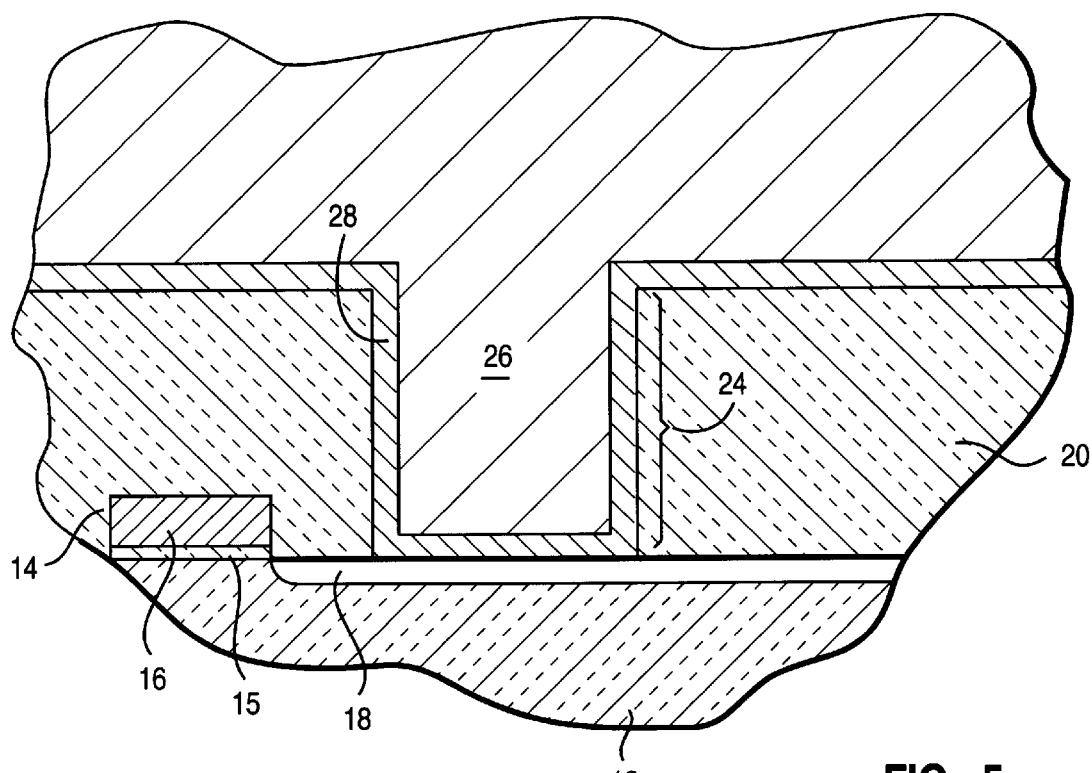
FIG. 5 is a cross-sectional view like FIG. 4 depicting deposition of tungsten in the opening in accordance with the present invention.
Figure 6:
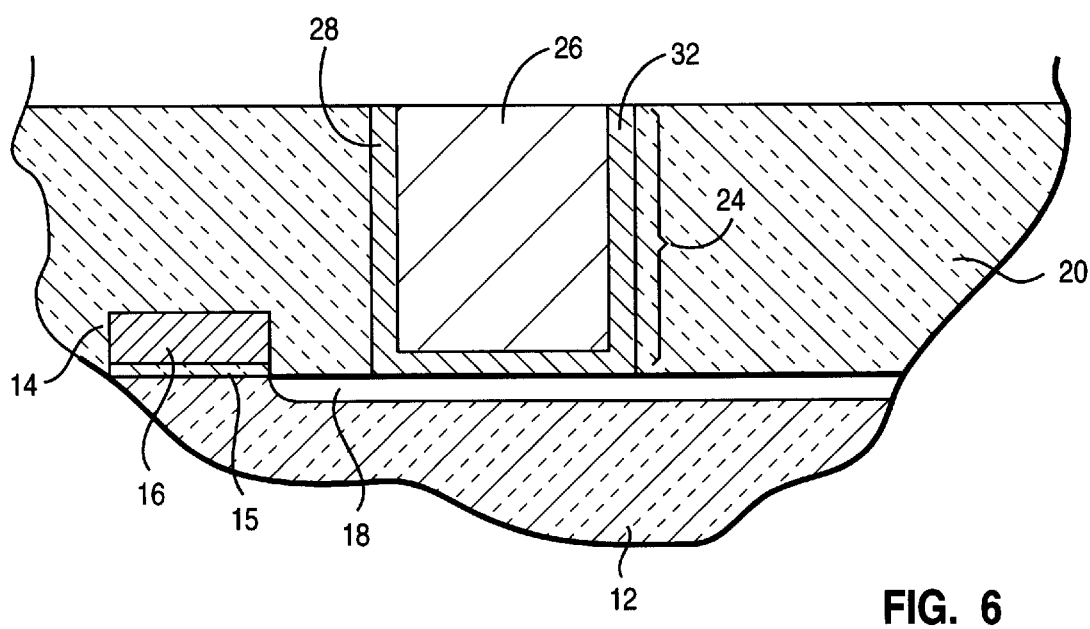
FIG. 6 is a cross-sectional view like FIG. 5 depicting planarization of the tungsten plug and the adhesion layer in accordance with the present invention.

The fabrication of the conducting plug 26 may be understood by referring now to FIGS. 5 and 6. Referring first to FIG. 5, tungsten 26 is blanket deposited over the adhesion layer 28, filling the opening 24. The thickness of the deposited tungsten is largely a matter of design discretion and will depend on the width and aspect ratio of the opening 24. The tungsten deposition may be by a variety of well known tungsten deposition techniques, such as, for example, silane reduction of $WF_6$ or $WCl_6$, followed by a hydrogen reduction of one of the same compounds. As shown in FIG. 6, the tungsten plug 26 and the portion of the adhesion layer 28 overlying the interlevel dielectric layer 20 are both planarized to the interlevel dielectric layer 20. This planarization may be by etchback planarization, chemical-mechanical-polishing, or other suitable planarization techniques. In an exemplary embodiment, the planarization is by chemical-mechanical-polishing. Thereafter, the conductor layer 22 shown in FIG. 1 may be applied using well known application techniques.

The skilled artisan will appreciate that the process in accordance with the present invention yields an adhesion layer 28 and associated tungsten plug 26 with improved protection against variable and undesirably high contact resistance due to the presence of unwanted oxygen and carbon atoms and insulating impurity structures formed thereby in the adhesion layer 28. The process in accordance with the present invention may be employed to fabricate an adhesion layer to establish an ohmnic contact to an underlying silicon based structure, or to establish contacts between adjacent global interconnect or local interconnect layers as desired.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a conducting layer on a structure, comprising:

decomposing tetrakis-dimethyl-amino-titanium vapor in the presence of the structure to deposit a layer containing titanium nitride and a compound of titanium nitrogen and carbon at a rate of about 9.4 to 10.6 Å/second and a thickness of less than about 105 Å; and exposing the deposited layer to a plasma ambient containing nitrogen and hydrogen to remove carbon and oxygen therefrom.

2. The method of claim 1, wherein the structure is heated to about 400 to 420° C. prior to the decomposition of the tetrakis-dimethyl-amino-titanium.

3. The method of claim 1, wherein the decomposition of the tetrakis-dimethyl-amino-titanium is performed at about 1.3 to 1.7 torr.

4. The method of claim 1, wherein the tetrakis-dimethyl-amino-titanium is mixed with a stream of inert gas prior to the decomposition.

5. The method of claim 1, wherein the plasma ambient contains about 3 parts nitrogen to about 5 parts hydrogen.

6. The method of claim 1, wherein the steps of decomposing tetrakis-dimethyl-amino-titanium to deposit the layer, and exposing the deposited layer to a plasma ambient are repeated until a desired thickness of the deposited layer is achieved.

7. A method of fabricating an adhesion layer in an opening of an insulating layer, comprising:

decomposing tetrakis-dimethyl-amino-titanium vapor in the presence of the opening to deposit a layer containing titanium nitride and a compound of titanium, nitrogen and carbon in the opening at a rate of about 9.4 to 10.6 Å/second and a thickness of less than about 105 Å; and exposing the deposited layer to a plasma ambient containing nitrogen and hydrogen to remove carbon and oxygen therefrom.

8. The method of claim 7, wherein the insulating layer is heated to about 400 to 420° C. prior to the decomposition of the tetrakis-dimethyl-amino-titanium.

9. The method of claim 7, wherein the decomposition of the tetrakis-dimethyl-amino-titanium is performed at about 1.3 to 1.7 torr.

10. The method of claim 7, wherein the tetrakis-dimethyl-amino-titanium is mixed with a stream of inert gas prior to the decomposition.

11. The method of claim 7, wherein the plasma ambient contains about 3 parts nitrogen to about 5 parts hydrogen.

12. The method of claim 7, wherein the steps of decomposing tetrakis-dimethyl-amino-titanium to deposit the layer, and exposing the deposited layer to a plasma ambient are repeated until a desired thickness of the deposited layer is achieved.

13. A method of fabricating an ohmic contact in an opening of an insulating layer, comprising:

decomposing tetrakis-dimethyl-amino-titanium vapor in the presence of the opening to deposit a layer containing titanium nitride and a compound of titanium, nitrogen and carbon in the opening at a rate of about 9.4 to 10.6 Å/second and a thickness of less than about 105 Å;

exposing the deposited layer to a plasma ambient containing nitrogen and hydrogen to remove carbon and oxygen therefrom; and depositing conducting material on the deposited layer.

14. The method of claim 13, wherein the conducting material comprises tungsten.

15. The method of claim 13, wherein the conducting material is planarized to the insulating layer.

16. The method of claim 13, wherein the insulating layer is heated to about 400 to 420° C. prior to the decomposition of the tetrakis-dimethyl-amino-titanium.

17. The method of claim 13, wherein the decomposition of the tetrakis-dimethyl-amino-titanium is performed at about 1.3 to 1.7 torr.

18. The method of claim 13, wherein the tetrakis-dimethyl-amino-titanium is mixed with a stream of inert gas prior to the decomposition.

19. The method of claim 13, wherein the plasma ambient contains about 3 parts nitrogen to about 5 parts hydrogen.

20. The method of claim 13, wherein the steps of decomposing tetrakis-dimethyl-amino-titanium to deposit the layer, and exposing the deposited layer to a plasma ambient are repeated until a desired thickness of the deposited layer is achieved.

* * * * *